United States Patent
Socha

(10) Patent No.: US 8,612,900 B2
(45) Date of Patent: Dec. 17, 2013

(54) RULE OPTIMIZATION IN LITHOGRAPHIC IMAGING BASED ON CORRELATION OF FUNCTIONS REPRESENTING MASK AND PREDEFINED OPTICAL CONDITIONS

(75) Inventor: Robert John Socha, Campbell, CA (US)

(73) Assignee: ASML Netherlands B.V., Veldhoven (NL)

(*) Notice: Subject to any disclaimer, the term of this patent is extended or adjusted under 35 U.S.C. 154(b) by 170 days.

(21) Appl. No.: 13/042,303

(22) Filed: Mar. 7, 2011

(65) Prior Publication Data

US 2011/0219342 A1 Sep. 8, 2011

Related U.S. Application Data

(60) Provisional application No. 61/311,155, filed on Mar. 5, 2010.

(51) Int. Cl.
*G06F 17/50* (2006.01)

(52) U.S. Cl.
USPC ............ 716/52; 716/50; 716/51; 716/53; 716/54; 716/55; 430/5; 430/30

(58) Field of Classification Search
USPC ................. 716/50–56; 430/5, 30
See application file for complete search history.

(56) References Cited

U.S. PATENT DOCUMENTS

| 7,079,223 B2 * | 7/2006 | Rosenbluth et al. ............ 355/67 |
| 7,493,589 B2 | 2/2009 | Socha |
| 7,514,183 B2 | 4/2009 | Hsu et al. |
| 7,639,864 B2 | 12/2009 | Socha et al. |

(Continued)

FOREIGN PATENT DOCUMENTS

| EP | 1 544 680 | 6/2005 |
| JP | 2004-312027 | 11/2004 |

(Continued)

OTHER PUBLICATIONS

Japanese Office Action mailed Nov. 1, 2012 in corresponding Japanese Patent Application No. 2011-039343.

*Primary Examiner* — Nha Nguyen

(74) *Attorney, Agent, or Firm* — Pillsbury Winthrop Shaw Pittman LLP

(57) ABSTRACT

Methods, computer program products and apparatuses for optimizing design rules for producing a mask are disclosed, while keeping the optical conditions (including but not limited to illumination shape, projection optics numerical aperture (NA) etc.) fixed. A cross-correlation function is created by multiplying the diffraction order functions of the mask patterns with the eigenfunctions from singular value decomposition (SVD) of a TCC matrix. The diffraction order functions are calculated for the original design rule set, i.e., using the unperturbed condition. ILS is calculated at an edge of a calculated image of a critical polygon using the cross-correlation results and using translation properties of a Fourier transform. The use of the calculated cross-correlation of the mask and the optical system, and the translation property of the Fourier transform for perturbing the design reduces the computation time needed for determining required changes in the design rules. Once an optimum separation is calculated, it is incorporated into the design rule to optimize the mask layout for improved ILS throughout the mask, including critical and non-critical portions of the mask.

18 Claims, 9 Drawing Sheets

(56) References Cited

U.S. PATENT DOCUMENTS

| | | |
|---|---|---|
| 7,864,301 B2 | 1/2011 | Socha |
| 2005/0142470 A1* | 6/2005 | Socha et al. .................. 430/30 |
| 2005/0177810 A1* | 8/2005 | Heng et al. ................... 716/21 |
| 2005/0196682 A1 | 9/2005 | Hsu et al. |
| 2007/0038972 A1* | 2/2007 | Noelscher et al. ............ 716/21 |
| 2007/0157154 A1 | 7/2007 | Socha |
| 2008/0301620 A1* | 12/2008 | Ye et al. ........................ 716/19 |
| 2009/0053621 A1 | 2/2009 | Socha |

FOREIGN PATENT DOCUMENTS

| | | |
|---|---|---|
| JP | 2005-141242 | 6/2005 |
| JP | 2005-183981 | 7/2005 |
| JP | 2007-183630 | 7/2007 |
| JP | 2008-065320 | 3/2008 |
| JP | 2009-092779 | 4/2009 |

\* cited by examiner

RULE OPTIMIZATION IN LITHOGRAPHIC IMAGING BASED ON CORRELATION OF FUNCTIONS REPRESENTING MASK AND PREDEFINED OPTICAL CONDITIONS

CROSS-REFERENCE TO RELATED APPLICATIONS

This application claims the benefit of U.S. Provisional Application No. 61/311,155 filed Mar. 5, 2010, which is incorporated herein by reference in its entirety.

FIELD

This disclosure relates generally to lithographic imaging. More particularly, it relates to optimization of design rules for producing a mask used in a lithographic apparatus.

BACKGROUND

Lithographic apparatus can be used, for example, in the manufacture of integrated circuits (ICs). In such a case, the mask (also referred to interchangeably as a "reticle" or a "patterning device") may contain a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "optics;" however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens."

The photolithographic masks referred to above comprise geometric patterns or polygons corresponding to the circuit components to be integrated onto a silicon wafer. The patterns used to create such masks are generated utilizing CAD (computer-aided design) programs, this process often being referred to as EDA (electronic design automation). Most CAD programs follow a set of design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. A critical dimension (CD) of a circuit can be defined as the smallest width of a line or hole or the smallest space between two lines or two holes. Thus, the CD determines the overall size and density of the designed circuit.

In a typical design flow, the mask and source are optimized for critical areas of the mask layout. For example, in a DRAM or SRAM, the critical area may be the memory cell. This source-mask optimization (SMO) result is then used for optimizing the mask in the non-critical areas. If the design rules of the non-critical areas are not properly chosen, the overlapping process window (OPW) of the critical area and non-critical area gets negatively impacted, e.g., non-critical areas may have insufficient Image Log Slope (ILS). Often, the design rule of the non-critical areas are re-optimized once the mask type and source is fixed for the critical area. In the conventional re-optimization process, the previous non-critical areas with insufficient ILS are included within the newly defined critical area, and the SMO process is performed again. Thus the complete lithographic optimization process becomes time-consuming and laborious.

Therefore, there is a need for a method that can improve lithographic imaging of the critical as well as non-critical areas of the mask without having to redo the SMO process.

SUMMARY

Embodiments of the present invention provide methods, computer program products and apparatuses for optimizing design rules for producing a mask, while using predefined the optical conditions. Optical conditions include optical settings such as illumination shape, projection optics numerical aperture (NA) etc. Optical conditions may also comprise other optical conditions present in the lithographic apparatus, such as, intensity fluctuations, divergence of the laser beam, illumination aberration, apodization, chromatic aberrations, and even thin-film properties of the wafer.

In one aspect of the present invention, a design optimization method comprises: selecting an initial design rule for the mask layout; selecting an autocorrelation function associated with a predefined optical condition of the lithographic apparatus; selecting respective diffraction order functions for at least two polygons in the mask layout; determining a desired distance between the at least two polygons by cross-correlating the diffraction order functions and the predefined autocorrelation function; and updating the initial design rule based on the determined value of the desired distance between the at least two polygons.

A further aspect of the invention involves using one or more eigenfunctions of transmission cross coefficient (TCC) matrix corresponding to a predefined illumination condition and a predefined projection optics condition.

In another aspect of the present invention, selecting the autocorrelation function includes: identifying a first portion of the mask layout that includes a plurality of critical polygons; and performing a source-mask optimization process based on the plurality of critical polygons to determine the predefined optical condition corresponding to the autocorrelation function.

In yet another aspect of the present invention, selecting the initial design rule includes: selecting an initial distance between the at least two polygons in the second portion of the mask layout based on the source-mask optimization performed using the plurality of critical polygons.

A further aspect of the invention includes: using translation properties of Fourier transform of the diffraction order functions to determine an optimum separation between polygons on the mask layout.

Another aspect of the present invention discloses a method wherein determining a desired distance between two polygons includes: calculating an image log slope (ILS) of an intensity profile at an edge of a calculated image of a first polygon including a contribution of at least one other polygon located at an initial distance '$a_0$' defined in the initial design rule; tracking the variation of ILS with variation of '$a_0$'; and selecting a value of '$a_0$' where variation of ILS is minimal to be the desired optimal distance between the first polygon and the other polygon.

The use of the calculated cross-correlation of the mask and the optical system, and the translation property of the Fourier transform for perturbing the design reduces the computation time needed for determining required changes in the design rules.

The invention itself, together with further objects and advantages, can be better understood by reference to the following detailed description and the accompanying drawings.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Figure 1A:
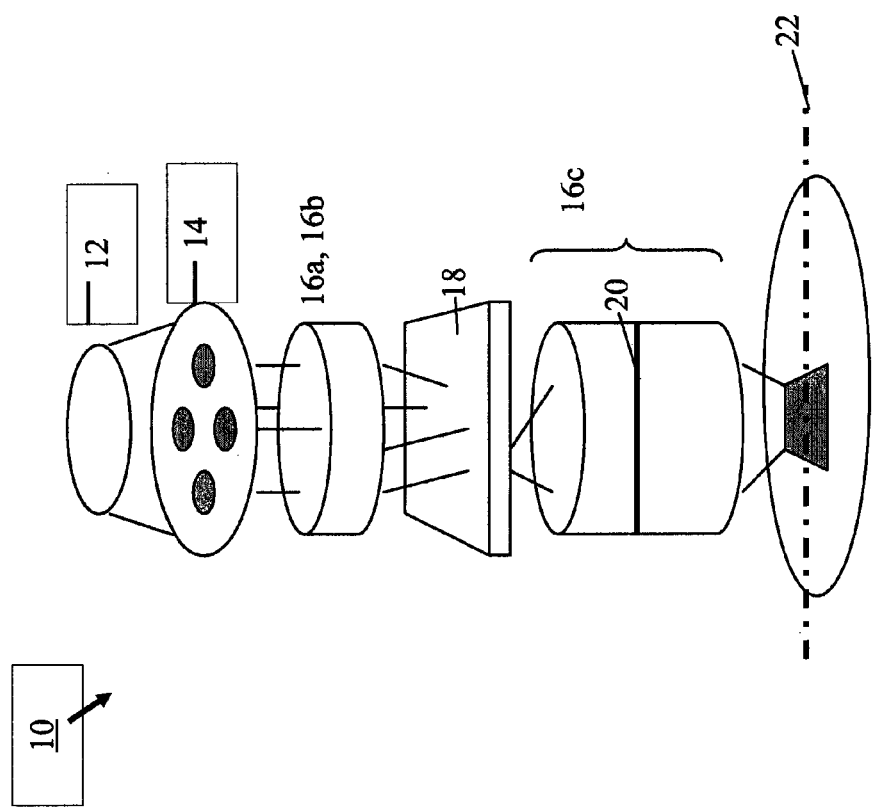
FIG. 1A is an exemplary block diagram illustrating a typical lithographic projection system.

General Environment in a Lithographic System for Implementing Example Embodiments of the Present Invention Prior to discussing the present invention, a brief discussion regarding the overall imaging process to be optimized is provided. FIG. 1A illustrates an exemplary lithographic projection system 10. The major components are a light source 12, which may be a deep-ultraviolet excimer laser source, illumination optics which define the partial coherence (denoted as sigma) and which may include specific source shaping optics 14, 16a and 16b; a mask or reticle 18; and projection optics 16c that produce an image of the reticle pattern onto the wafer plane 22. An adjustable filter or aperture 20 at the pupil plane may restrict the range of beam angles that impinge on the wafer plane 22, where the largest possible angle defines the numerical aperture of the projection optics $NA = \sin(\theta_{max})$.

Figure 1B:
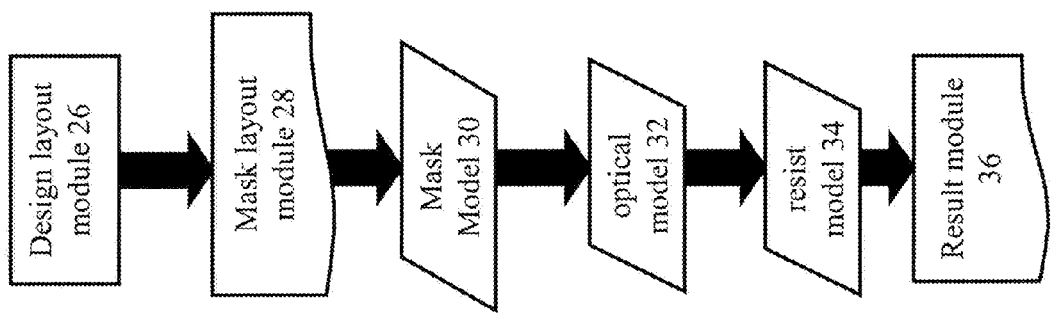
FIG. 1B is an exemplary block diagram illustrating the functional modules of a lithographic simulation model.

In a lithography system, these major system components are described by separate functional modules, for example, as illustrated in FIG. 1B. Referring to FIG. 1B, the functional modules include the design layout module 26, which defines the target design; the mask layout module 28, which defines how the mask is laid out using the target design to be utilized in the imaging process; the mask model module 30, which models the properties of the physical mask to be utilized during the simulation process; the optical model module 32, which defines the performance of the optical components of lithography system; and the resist model module 34, which defines the performance of the resist being utilized in the given process. As is known, the result of the simulation process produces, for example, predicted contours and CDs in the result module 36.

More specifically, it is noted that the properties of the illumination and projection optics are captured in the optical model module 32 that includes, but is not limited to, NA-sigma ($\sigma$) settings as well as any particular illumination source shape, where $\sigma$ (or sigma) is the inner and/or outer radial extent of the illuminator. The optical properties of the photo-resist layer coated on a substrate—i.e. refractive index, film thickness, propagation and polarization effects—may also be captured as part of the optical model module 32.

Finally, the resist model module 34 describes the effects of chemical processes which occur during resist exposure, PEB and development, in order to predict, for example, contours of resist features formed on the substrate wafer. The objective of the simulation is to accurately predict, for example, edge placements and critical dimensions (CDs), which can then be compared against the target design. The target design is generally defined as the pre-OPC mask layout, and will be provided in a standardized digital file format, such as GDSII or OASIS.

In general, the connection between the optical and the resist model is a simulated aerial image within the resist layer, which arises from the projection of light onto the substrate, refraction at the resist interface and multiple reflections in the resist film stack. The light intensity distribution (i.e. aerial image intensity) is turned into a latent "resist image" by absorption of photons, which is further modified by diffusion processes and various loading effects. Efficient simulation methods approximate the realistic 3-dimensional intensity distribution in the resist stack by a 2-dimensional aerial (and resist) image.

As discussed in the background section, this invention updates the design layout module 26 to produce an optimized mask layout module 28.

A design rule optimization process of the present invention will be described with reference to the accompanying drawings. Although this process is applicable to any layer such as bright field gate or dark field metal layers, and any target pattern, this exemplary embodiment addresses optimization of design rules for contact holes. The process is applicable for optimizing design rules for random target patterns or for periodic target patterns, such as, a memory cell.

In a typical lithography design process, the lithographers know which areas in a mask are critically important to optimize illumination and/or other optical conditions. After optimizing illumination (usually by performing a source mask optimization (SMO) process), lithographers usually look for regions in the non-critical areas of the mask that have insufficient intensity for the photoresist to resolve. In other words, mask regions with insufficient Image Log Slope (ILS) are identified. At this point, lithographers have primarily two choices. The most common choice is adding the regions with insufficient ILS to redefine the critical area, and perform the source-mask optimization process again. Instead of performing multiple SMO processes, lithographers may perform a full-chip optimization process too. One such exemplary illumination optimization process is described in U.S. Pat. No. 7,639,864, titled, "Method, Program Product and Apparatus for Optimizing Illumination for Full-Chip Layer," which is incorporated by reference herein. The alternative choice is recommending design rule changes for the non-critical (and/or critical) areas, as discussed in the present application.

Example Methods of the Present Invention

Figure 2:
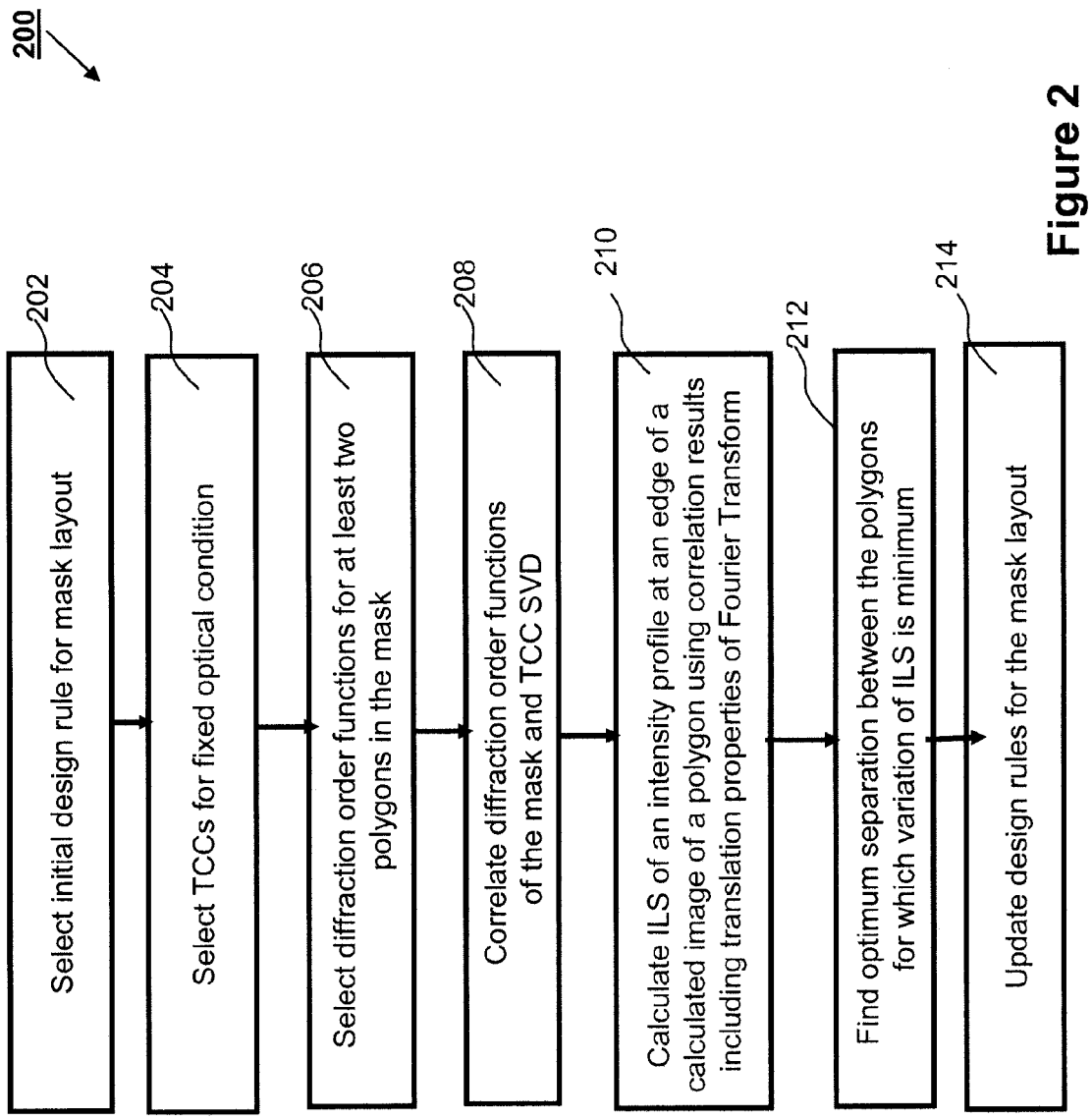
FIGS. 2-4 show example flowcharts illustrating various steps of the methods, according to embodiments of the present invention.

FIG. 2 is an exemplary flowchart illustrating the method of optimizing design rules in accordance with an embodiment of the present invention. The present method uses the transmission cross coefficient (TCC) functions of a lithography system, among other things. TCC function is the autocorrelation of the illumination pupil with the projection pupil, described, for instance, by M. Born and E. Wolf, Principles of Optics 530 (6th ed., Pergamon Press), incorporated herein by reference. The TCC represents the image transfer function of the optical system. The TCC function depends on optical conditions in the pupil plane, including the optical conditions of the illumination optics and the projection lens optics. Both the illumination optics and projection lens optics can be represented by a pupil plane image. The pupil plane of the illumination optics, also known as the illumination pupil, takes into account all the variability of the illumination optics. These variables include NA of the illumination (NA illumination=sigma*NA projection lens), intensity fluctuations, divergence of the laser beam, field differences, and even illumination aberrations. The projection lens pupil, also known as the projection pupil, includes NA, aberrations, apodization, chromatic aberrations, and thin-film properties of the wafer, among other things. So the TCC does take into account all possible optical variations in a lithographic apparatus. Using the TCC formulation in calculating the wafer image from a mask is advantageous because the TCC is independent of the mask. The image on the wafer is calculated by integrating over the product of the TCC and the mask.

The mask comprises a plurality of polygons representing the target patterns. A critical polygon is one that has a small separation to a neighboring polygon by less than a distance k1*lambda/NA where k1 is the minimum resolvable k1, and lambda is the wavelength of the radiation. An alternative definition of critical polygon is a polygon that has a point with ILS that is too low for the photoresist to resolve. A critical polygon may be included in a predefined critical area of a mask, or it may be in another area of the mask which is initially considered to be non-critical. As described earlier, if a critical polygon is identified in a predefined "non-critical" area, then the portion of the initial "non-critical" area may be included while redefining the critical area in the next iteration.

Flowchart 200 in FIG. 2 shows some key steps of an example method of optimizing design rules, according to one example embodiment. The detailed mathematical analysis of the steps of flowchart 200 is described in a subsequent section.

Figure 3:
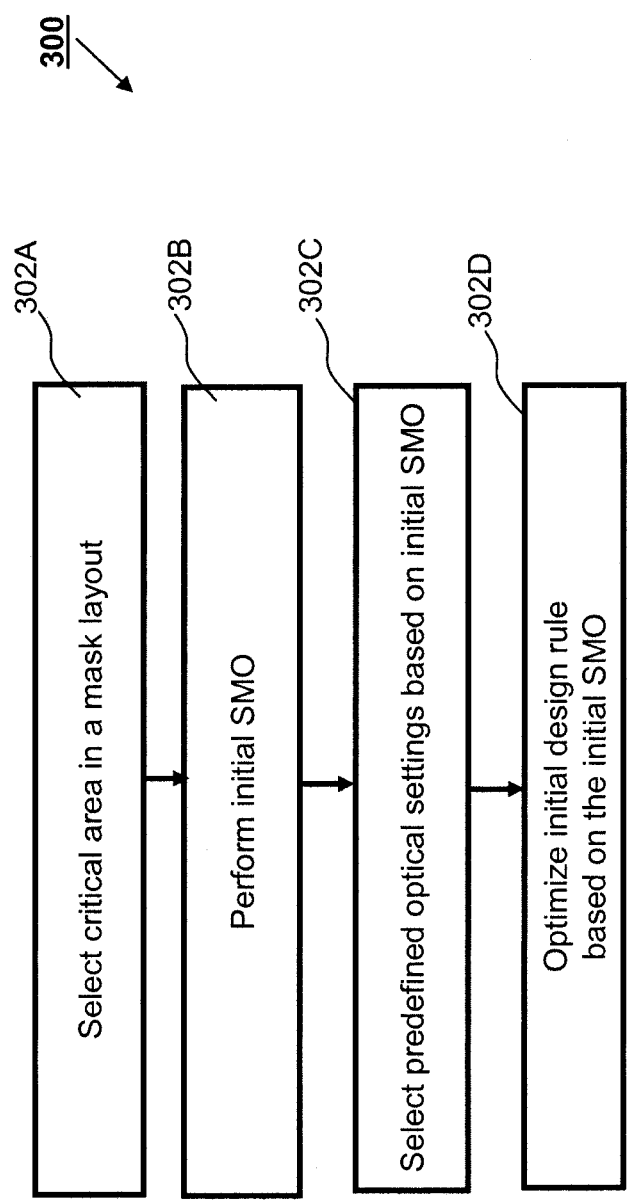

Flowchart 200 starts with step 202, where an initial design rule for the mask layout is selected. The initial design rule may be selected from previous experience, for example, from a previous generation of devices. Alternatively, as shown in FIG. 3, initial design rule may be optimized as a result of an SMO step.

In step 204, a set of predefined optical conditions are selected, and the corresponding TCCs are selected. Again, the predefined optical condition selection may be done from previous experience, or may be done as a result of an initial SMO. As discussed before, optical conditions include optical settings such as illumination shape, projection optics numerical aperture (NA) etc. Optical conditions may also comprise other optical conditions present in the lithographic apparatus, such as, intensity fluctuations, divergence of the laser beam, illumination aberration, apodization, chromatic aberrations, and even thin-film properties of the wafer.

In step 206, a plurality of polygons is selected. These polygons may comprise the initially identified critical polygons, or arbitrarily selected polygons in the non-critical portions of the mask. At least two polygons are selected, the distance between which is thought to be critical or near-critical. Typically, a number of polygons within an ambit distance of a point of interest is considered. The polygons may be adjacent to each other, but does not have to be adjacent if they are within ambit distance of each other. The ambit distance is defined as the distance beyond which the intensity quickly decays and becomes irrelevant for ILS calculation. The diffraction order function corresponding to the plurality of polygons is taken into account.

In step 208, a cross-correlation function is created by multiplying the diffraction order functions of the mask patterns with the eigenfunctions from singular value decomposition (SVD) of a TCC matrix. One or more eigenfunctions of the TCC matrix can be considered in the calculation. In some example embodiments, only one eigenfunction with the highest eigenvalue may be considered, if the other eigenfunctions do not contribute significantly. The diffraction order functions are calculated for the original design rule set, i.e., using the unperturbed condition. Since the diffraction orders are for the original design rules, and since the source and scanner optical conditions are fixed, this cross-correlation function can be pre-calculated or can be calculated during the process of the present invention.

In step 210, ILS of an intensity profile is calculated at an edge of a calculated image of a polygon using the cross-correlation results and using translation properties of a Fourier transform. The polygon may be a critical polygon. The use of the calculated cross-correlation of the mask and the optical system, and the translation property of the Fourier transform for perturbing the design reduce the computation time needed for determining required changes in the design rules.

In step 212, an optimum separation between two polygons is calculated. For this optimum separation, variation of ILS with separation is minimum, i.e. d(ILS)/dx approaches zero.

Once the optimum separation is calculated, it is incorporated into the design rule to update the design rule, and optimize the mask layout for improved ILS throughout the mask, including critical and non-critical portions of the mask. This is shown in step 214.

Flowchart 300 in FIG. 3 shows one example method for selecting the initial design rule, if the initial design rule is not already optimized, specially for the non-critical portions of the mask. In this method, a specific area of a mask is identified, as shown in step 302A. The specific area may be a critical area containing critical polygons. This can be done from previous experience. An initial SMO is performed next in step 302B, which may be based on the critical polygons included in the critical portion of the mask layout. Based on the initial SMO, predefined optical conditions are selected (i.e., TCCs are pre-calculated) in step 302C.

In step 302D, initial design rule is updated based on the SMO. In this way, design rule for the initially identified non-critical areas of the mask is pre-optimized before the start of the method of FIG. 2. The method of FIG. 2 may be considered as a further post-optimization method for the already pre-optimized design rule for the non-critical areas. Persons skilled in the art will appreciate that although it is generalized that the initial "non-critical" areas of the mask layout is thought to comprise of only non-critical polygons, the definition of a critical polygon is relative. A non-critical polygon with insufficient ILS resolution may have to be redefined as a critical polygon.

Figure 4:
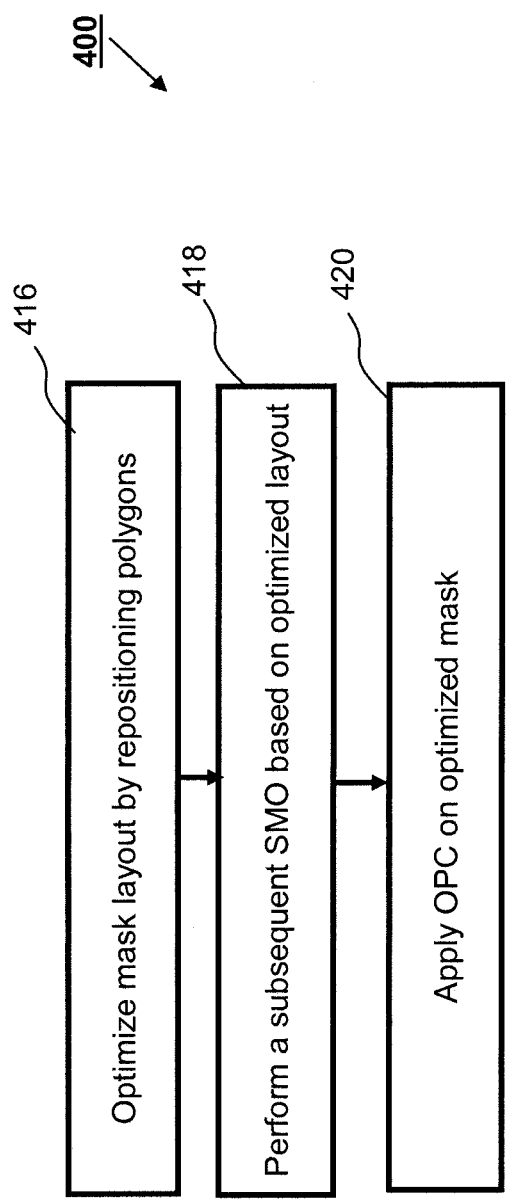

Flowchart 400 in FIG. 4 shows some optional steps that may follow step 214 from FIG. 2, where design rules are updated suing the algorithm of the present invention. In step 416, the mask layout is optimized by repositioning the polygons. This step includes shifting at least some of the polygons relative to each other. This step may or may not include repositioning of the edges of the polygon.

In step 418, a subsequent SMO may be performed after the mask layout is optimized to further fine-tune lithographic process window.

In step 420, optical proximity correction (OPC) may be optionally applied as a manufacturing fine-tuning step that follows the mask design optimization.

Persons skilled in the art will appreciate that the methods shown in FIGS. 2-4 only depict illustrative steps. Not all the steps need to be included in every embodiment, and additional intermediate/terminal steps may be included in the methods, as applicable. The sequence of the steps may be altered.

Example Results of the Present Invention

Figure 5:
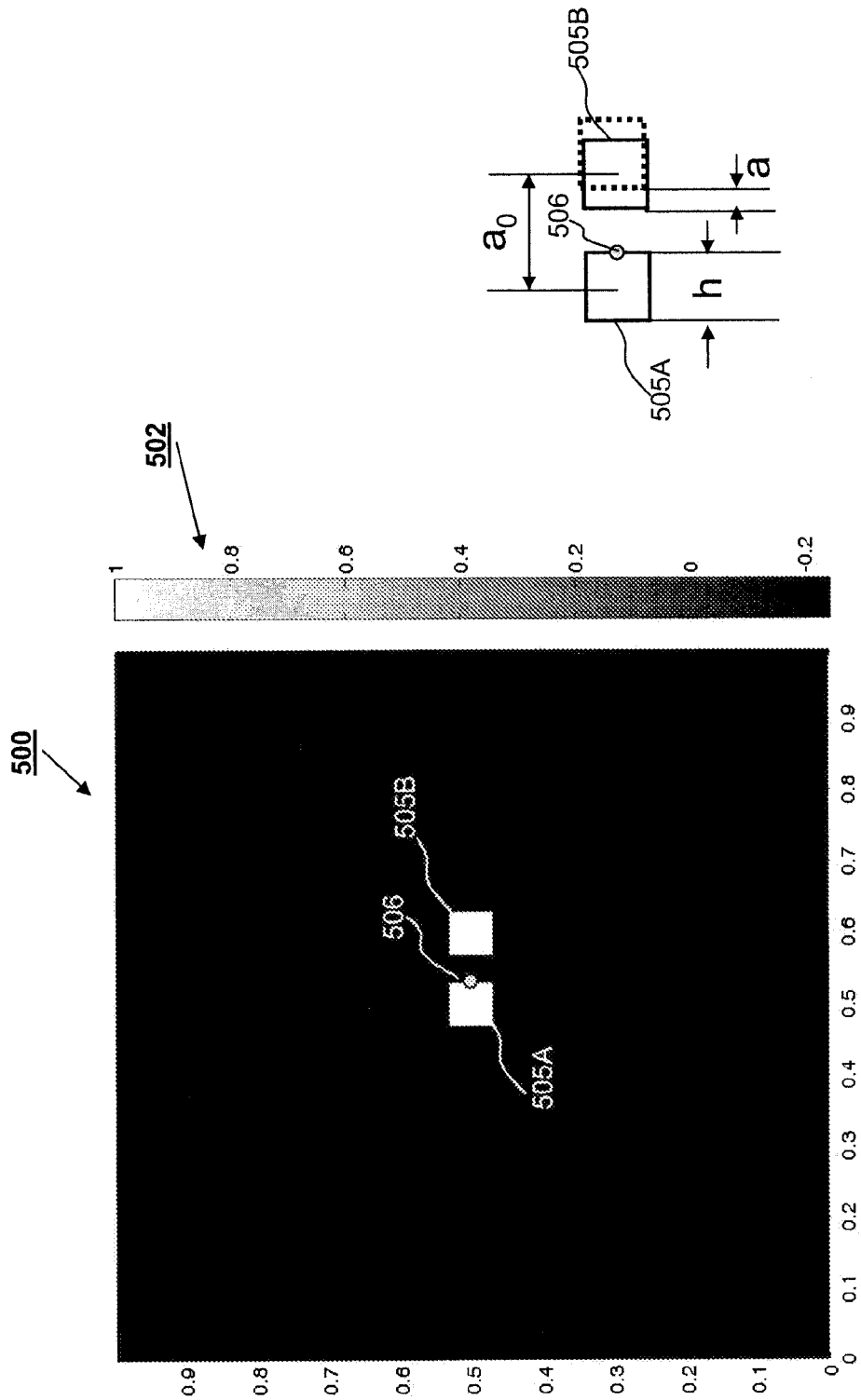
FIGS. 5A-5B illustrate an example mask pattern used to show the effectiveness of the present design optimization algorithm.

FIG. 5A illustrates an example mask pattern 500 that may be used to illustrate the results of the design optimization algorithm of the present invention. The mask pattern 500 comprises two adjacent square holes 505A and 505B with an initial center to center separation $a_0$, as shown in FIG. 5B. In one illustrative example, dimensions of the square holes may be h=60 nm, and the separation $a_0$=0.1 μm, as can be seen in a typical memory cell for DRAM or SRAM. A point 506 is identified on the edge of polygon 505A, where the ILS is to be calculated. ILS at point 506 has contribution from both the polygons 505A and 505B, as polygon 505B is within the ambit distance. The intensity bar 502 schematically depicts the relative transmission of the mask pattern. Conventional unpolarized illumination with a fill factor σ=0.2 and 193 nm wavelength is considered for the given mask pattern in FIG. 5A with a fixed NA of 1.35. It is assumed that a resist with an index of 1.7 is used to image the mask pattern, and the substrate is perfectly index-matched to the resist. Persons skilled in the art will appreciate that these illustrative dimensions and lithography parameters are not limiting to the scope of the invention.

Figure 6:
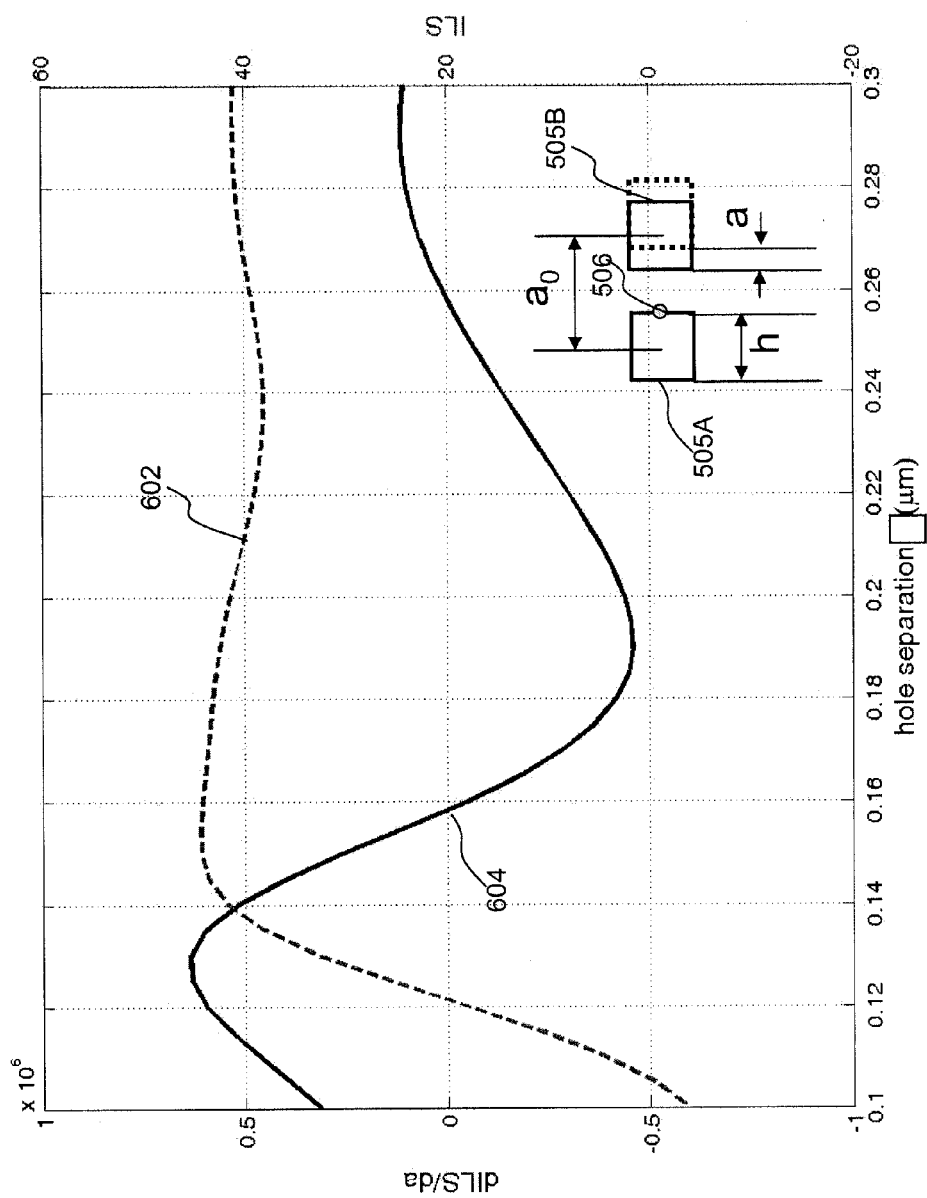
FIG. 6 compares the results of the present algorithm with results obtained by conventional methods of design optimization.

FIG. 6 shows plots of ILS (curve 602) and the variation of ILS with respect to variation of hole separation (curve 604). As shown by the dotted lined square in FIG. 5B, the square 505B is translated in x direction by an amount of 'a', so that the center to center separation becomes $(a_0+a)$. The ILS curve 602 is plotted using all the eigenvectors of the TCC matrix without any approximation, i.e., the imaging is exact. The maximum ILS is obtained at 0.155 μm.

The goal of the algorithm of the present invention is to find out an optimum value of 'a' with some mathematical approximation that leads to faster convergence of the algorithm. In other words, $\partial(ILS)/\partial a$ obtained by the algorithm of the present invention should be zero at a hole separation value that is exactly equal to or very close to the ideal value of 0.155 μm. As seen from the plot 604, $\partial(ILS)/\partial a$ is zero at a hole separation value of 0.158 μm. This result is obtained by using only one eigenvector instead of a full gamut of eigenvectors. Therefore the computation time is reduced, but the result is not compromised significantly. This proves that the present invention is a good predictor of the optimal separation that is used to update the design rule.

Mathematical Framework of the Present Invention

For illustrating the basic principle of the present invention, first, a design rule comprising only two polygons is considered, as shown in FIG. 5A-5B. This method will be generalized for multiple polygons in the subsequent discussion. A function representing a first polygon (e.g., 505A) is denoted as $t_0(x,y)$, and a function representing a second polygon (e.g., 505B) is denoted as $t_1(x,y)$. Each of these polygons have a respective mask transmittance and phase associated with it. The total mask function is the summation of these two individual polygon functions, and is denoted by:

$$t(x,y)=t_0(x,y)+t_1(x,y) \qquad \text{(equation 1)}$$

The diffraction orders of this polygon are denoted as $T_0(k_x, k_y)$ and $T_1(k_x, k_y)$, respectively. The total diffraction orders is denoted by:

$$T(kx,ky)=T0(kx,ky)+T1(kx,ky) \qquad \text{(equation 2)}$$

First, one point $(x_0, y_0)$ on polygon $t_0$ is considered where the intensity or image log slope (ILS) is calculated. It is important to note, only polygons within the ambit distance of $(x_0, y_0)$ need to be examined, as polygons separated by a distance larger than an ambit will have no effect on the intensity or ILS at $(x_0, y_0)$. The minimum ambit is defined as the wavelength divided by the numerical aperture (NA) of the lithographic apparatus for the purpose of design rule optimization. It is to be noted that ambit might be defined otherwise for OPC steps that may follow the design rule optimization.

Second, the polygon, $t_1(x,y)$ is translated by a small distance, $\bar{a}$. The translated polygon is given by the function $t_1(|\bar{r}+\bar{a}|)$. If the translation is only in x, the function becomes:

$$t_1(|\bar{r}+\bar{a}|)=t_1(|\bar{r}+\hat{x}a|)=t_1(x+a,y) \quad \text{(equation 3)}$$

The electric field of polygon $t_0$ at the wafer is given by $f(x,y)$, and the electric field of translated polygon $t_1$ is given by $g(x+a,y)$. The total electric field is then:

$$h(x,y)=f(x,y)+g(x+a,y) \quad \text{(equation 4)}$$

The intensity at the wafer is then given by:

$$I(x,y)=h(x,y)h^*(x,y)=[f(x,y)+g(x+a,y)][f^*(x,y)+g^*(x+a,y)] \quad \text{(equation 5)}$$

where * denotes the complex conjugate.
Simplifying equation 5 yields:

$$I(x,y)=f(x,y)f^*(x,y)+2Re[f(x,y)g^*(x+a,y)]+g(x+a,y)g^*(x+a,y) \quad \text{(equation 6)}$$

Intensity at a point $(x_0, y_0)$ that is on polygon to is given by:

$$I(x_0,y_0)=f(x_0,y_0)f^*(x_0,y_0)+2Re[f(x_0,y_0)g^*(x_0+a,y_0)]+g(x_0+a,y_0)g^*(x_0+a,y) \quad \text{(equation 7)}$$

Since the polygon $t_1$ with electric field $g(x_0,y_0)$ at point $(x_0,y_0)$ has little effect on the intensity $I(x_0,y_0)$, the equation 7 can be approximated by:

$$I(x_0,y_0) \approx f(x_0,y_0)f^*(x_0,y_0)+2Re[f(x_0,y_0)g^*(x_0+a,y_0)] \quad \text{(equation 8)}$$

Furthermore, the change in the intensity $I(x_0,y_0)$ due the distance, a, is of concern. The derivative of $I(x_0,y_0)$ with respect to a is given by:

$$\frac{\partial I(x_0, y_0)}{\partial a} \approx 2Re\left[f(x_0, y_0)\frac{\partial g^*(x_0+a, y_0)}{\partial a}\right] \quad \text{(equation 9)}$$

The electric field $f(x,y)$ at $t_0$ is given by:

$$f(x,y) = \sum_c t_0(x,y) * \phi_c(x,y) \quad \text{(equation 10)}$$

where $\phi_c(x,y)$ is the inverse Fourier transform of the SVD kernels and * denotes the convolution operator.
The electric field $g(x,y)$ at $t_1$ is given by:

$$g(x,y) = \sum_c t_1(x,y) * \phi_c(x,y) \quad \text{(equation 11)}$$

In this analysis, a coherent illumination source is considered. For the coherent source, there is only one kernel, $\phi$. This kernel is the Airy function of the projection optics. Therefore, equation 10 is simplified to:

$$f(x,y)=t_0(x,y)*\phi_1(x,y) \quad \text{(equation 12)}$$

and, equation 11 becomes simplified to:

$$g(x,y)=t_1(x,y)*\phi_1(x,y). \quad \text{(equation 13)}$$

The $\partial I/\partial a$ is calculated for this coherent illumination source. From the equations 12 and 13 above:

$$f(x_0,y_0)g^*(x_0+a,y_0)=[t_0(x,y)*\phi_1(x,y)][t_1(x+a,y)*\phi_1(x,y)]^*. \quad \text{(equation 14)}$$

This equation is then converted to the Fourier domain with variables $(k_x, k_y)$.

$$f(x_0,y_0)g^*(x_0+a,y_0)=\iint e^{i2\pi x k_x}e^{i2\pi y k_y}T_0(k_x,k_y)\Phi_1(k_x,k_y)dk_x dk_y \iint e^{-i2\pi x k'_x}e^{-i2\pi y k'_y}e^{-2\pi a k'_x}T^*_1(-k'_x,-k'_y)\Phi^*_1(-k'_x,-k'_y)dk'_x dk'_y =$$
$$\iiiint e^{i2\pi x(k_x-k'_x)}e^{i2\pi y(k_y-k'_y)}e^{-i2\pi a k'_x}T_0(k_x,k_y)T^*_1(-k'_x,-k'_y)\Phi_1(k_x,k_y)\Phi^*_1(-k'_x,-k'_y)dk_x dk_y dk'_x dk'_y \quad \text{(equation 15)}$$

After a transformation of variables $p=k_x+k'_x$ and $q=k_y+k'_y$, equation 15 above becomes:

$$=\iint e^{i2\pi x p}e^{i2\pi y q}dp dq \iint e^{i2\pi a k_x}T_0(p-k_x,q-k_y)T^*_1(k_x,k_y)\Phi_1(p-k_x,q-k_y)\Phi^*_1(k_x,k_y)dk_x dk_y \quad \text{(equation 16)}$$

The second double integral can be written as variable F(p, q, a) as shown below:

$$f(x_0,y_0)g^*(x_0+a,y_0)=\iint e^{i2\pi x p}e^{i2\pi y q}F(p,q,a)dpdq \quad \text{(equation 17)}$$

where, $$F(p,q,a)=\iint e^{i2\pi a k_x}T_0(p-k_x,q-k_y)T^*_1(k_x,k_y)\Phi_1(p-k_x,q-k_y)\Phi^*_1(k_x,k_y)dk_x dk_y \quad \text{(equation 18)}$$

F(p,q,a) of equation 18 is the cross-correlation of the Fourier transform of $t_0$, denoted by $T_0$, multiplied by the kernel $\Phi_1$ with the untranslated Fourier transform of t1, denoted by $T_1$, multiplied by the kernel $\Phi_1$.

A change in the electric field at $t_1$ due to a change in the translational distance 'a' results in the following:

$$f(x_0, y_0)\frac{\partial g^*(x_0+a, y_0)}{\partial a} = \quad \text{(equation 19)}$$
$$\iint e^{i2\pi x p}e^{i2\pi y q}F'(p, q, a)dpdq$$

where F'(p,q,a) is given by:

$$F'(p,q,a)=i2\pi \iint k_x e^{i2\pi a k_x}T_0(p-k_x,q-k_y)T^*_1(k_x,k_y)\Phi_1(p-k_x,q-k_y)\Phi^*_1(k_x,k_y)dk_x dk_y \quad \text{(equation 20)}$$

In order to calculate the change in intensity, I, with respect to the distance 'a', $\partial I/\partial a$, the real part of $$f(x_0, y_0)\frac{\partial g^*(x_0+a, y_0)}{\partial a}$$

needs to be calculated. This is shown below:

$$2Re\left[f(x_0, y_0)\frac{\partial g^*(x_0+a, y_0)}{\partial a}\right] = \quad \text{(equation 21)}$$
$$2\iint dpdq[A(p, q, a)\cos[2\pi(xp+yq)] - B(p, q, a)\sin[2\pi(xp+yq)]]$$

where $F'(p,q,a)=A(p,q,a)+iB(p,q,a)$. (equation 22)

In order to calculate the ILS, the change in $\partial I/\partial a$ with respect x and y also needs to be calculated. This is shown below:

$$\frac{\partial^2 I(x_0, y_0)}{\partial a \partial x} \approx 4\pi \text{Re}\left[\int\int ipe^{i2\pi xp}e^{i2\pi yq}F'(p,q,a)dpdq\right] = \quad \text{(equation 23)}$$
$$-4\pi \int\int pdpdq[B(p,q,a)\cos[2\pi(xp+yq)] +$$
$$A(p,q,a)\sin[2\pi(xp+yq)]]$$

$$\frac{\partial^2 I(x_0, y_0)}{\partial a \partial y} \approx 4\pi \text{Re}\left[\int\int iqe^{i2\pi xp}e^{i2\pi yq}F'(p,q,a)dpdq\right] = \quad \text{(equation 24)}$$
$$-4\pi \int\int qdpdq[B(p,q,a)\cos[2\pi(xp+yq)] +$$
$$A(p,q,a)\sin[2\pi(xp+yq)]]$$

The metric of the optimization process is to find the value of 'a' such that the change in ILS is minimized. This is done by minimizing the change in ILS with respect to 'a', so that $$\frac{\partial ILS}{\partial a} \to 0.$$

The ILS is defined as:

$$ILS = \hat{n} \cdot \nabla[\ln(I)] = (\hat{n} \cdot \overline{\nabla I})/I \quad \text{(equation 25)}$$

where n̂ is the normal with respect the polygon $t_0$ edge at point $(x_0, y_0)$.

In Cartesian coordinates, $\hat{n} = \hat{x}\cos n + \hat{y}\sin n$ where n is the angle of the normal with respect to the polygon edge. Therefore, the ILS becomes:

$$ILS = \frac{1}{I}\left[\left(\frac{\partial I}{\partial x}\cos n\right)^2 + \left(\frac{\partial I}{\partial y}\sin n\right)^2\right]^{1/2} \quad \text{(equation 26)}$$

The change in ILS with respect to 'a' is then given by:

$$\frac{\partial ILS}{\partial a} = -\frac{1}{I^2}\frac{\partial I}{\partial a}\left[\left(\frac{\partial I}{\partial x}\cos n\right)^2 + \left(\frac{\partial I}{\partial y}\sin n\right)^2\right]^{1/2} + \quad \text{(equation 27)}$$
$$\frac{1}{I}\left[\left(\frac{\partial I}{\partial x}\cos n\right)^2 + \left(\frac{\partial I}{\partial y}\sin n\right)^2\right]^{-1/2}\left[\right.$$
$$\left(\frac{\partial I}{\partial x}\cos n\right)\frac{\partial^2 I}{\partial x \partial a} + \left(\frac{\partial I}{\partial y}\sin n\right)\frac{\partial^2 I}{\partial y \partial a}\left.\right]$$

Without a loss of generality, for a normal of $\hat{n}=\hat{x}$ where n=0° the $\partial I/\partial a$ becomes:

$$\frac{\partial ILS}{\partial a} = -\frac{1}{I^2}\frac{\partial I}{\partial x}\frac{\partial I}{\partial a} + \frac{1}{I}\frac{\partial^2 I}{\partial x \partial a} \quad \text{(equation 28)}$$

Again, the goal is to minimize the change in ILS with respect to a, $$\frac{\partial ILS}{\partial a} \to 0,$$

i.e., $$-\frac{1}{I}\frac{\partial I}{\partial x}\frac{\partial I}{\partial a} + \frac{\partial^2 I}{\partial x \partial a} = 0. \quad \text{(equation 29)}$$

For this case where n=0°, $\partial^2 I/\partial x \partial a$ and $\partial I/\partial a$ derived above in equations 23 and 24 are substituted in the equation 29 above.

$$\frac{\partial^2 I}{\partial x \partial a} - \frac{1}{I}\frac{\partial I}{\partial x}\frac{\partial I}{\partial a} = \quad \text{(equation 30)}$$
$$-4\pi \int\int pdpdq[B(p,q,a)\cos[2\pi(xp+yq)] +$$
$$A(p,q,a)\sin[2\pi(xp+yq)]] -$$
$$\frac{1}{I}\frac{\partial I}{\partial x}2\int\int dpdq[A(p,q,a)\cos[2\pi(xp+yq)] -$$
$$B(p,q,a)\sin[2\pi(xp+yq)]] = 0.$$

Although the intensity, I, and derivative of I with respect to x, $\partial I/\partial x$, is a function of 'a', as a first order approximation the change in $I \cdot \partial I/\partial x$, which is the log slope, is assumed to be small as 'a' changes. This log slope can be replaced by the initial unperturbed log slope, $ILS_0$ as shown below:

$$\frac{\partial^2 I}{\partial x \partial a} - \frac{1}{I}\frac{\partial I}{\partial x}\frac{\partial I}{\partial a} = \quad \text{(equation 31)}$$
$$-4\pi \int\int pdpdq[B(p,q,a)\cos[2\pi(xp+yq)] +$$
$$A(p,q,a)\sin[2\pi(xp+yq)]] -$$
$$ILS_0 2\int\int dpdq[A(p,q,a)\cos[2\pi(xp+yq)] -$$
$$B(p,q,a)\sin[2\pi(xp+yq)]] = 0.$$

In order to find the optimal 'a', the integral equation above is solved to find a value of 'a' which minimizes it.

It is to be noted that the calculation above for coherent illumination with one eigenfunction of the TCC, $\Phi_1$, can be generalized for any illumination. Recalling that:

$$A(p,q,a) = Re[F'(p,q,a)] \quad \text{(equation 32)}$$

$$B(p,q,a) = Im[F'(p,q,a)] \quad \text{(equation 33)}$$

Where F' for coherent illumination is given by:

$$F'(p,q,a) = i2\pi \iint k_x e^{i2\pi a k_x} T_0(p+k_x, q+k_y) T^*_1(k_x, k_y) \Phi_1(p+k_x, q+k_y) \Phi^*_1(k_x, k_y) dk_x dk_y \quad \text{(equation 34)}$$

F' can be generalized to any illumination by considering a plurality of eigenfunctions, that may include all the eigenfunctions of the TCC:

$$F'(p,q,a) = \quad \text{(equation 35)}$$
$$i2\pi \int\int k_x dk_x dk_y e^{i2\pi a k_x} T_0(p+k_x, q+k_y) T^*_1(k_x, k_y)$$
$$\sum_c \sum_d \Phi_c(p+k_x, q+k_y)\Phi^*_d(k_x, k_y)$$

Figure 7:
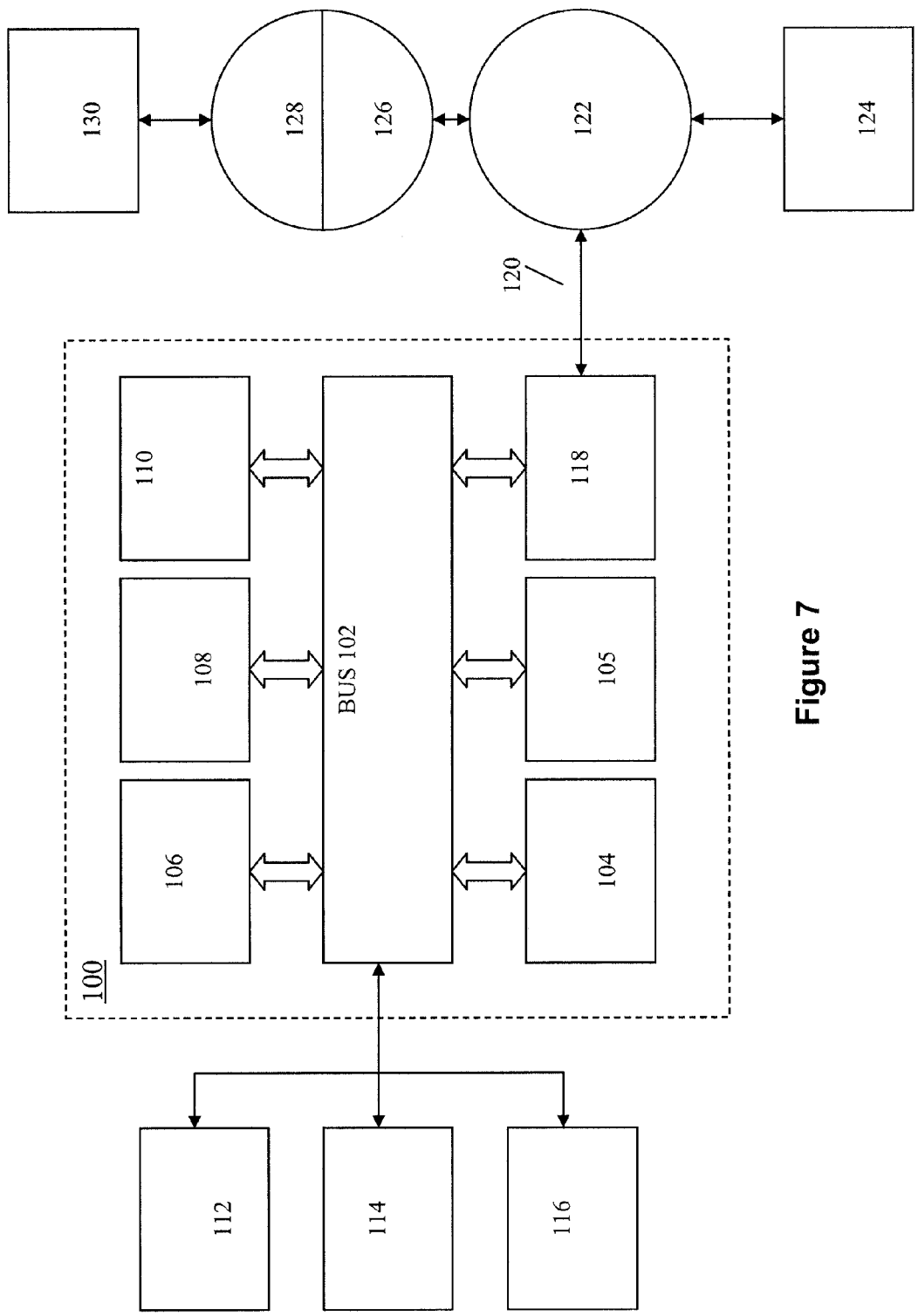
FIG. 7 is a block diagram that illustrates a computer system which can assist in the implementation of the design optimization method of the present invention.

Details of a Computer System for Implementing the Embodiments of the Present Invention FIG. 7 is a block diagram that illustrates a computer system 100 which can assist and/or implement the design rule optimization methods for lithographic tools, as disclosed herein. Computer system 100 includes a bus 102 or other communication mechanism for communicating information, and one or more processor(s) 104 (and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the design rule optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Example Lithography Tool

Figure 8:
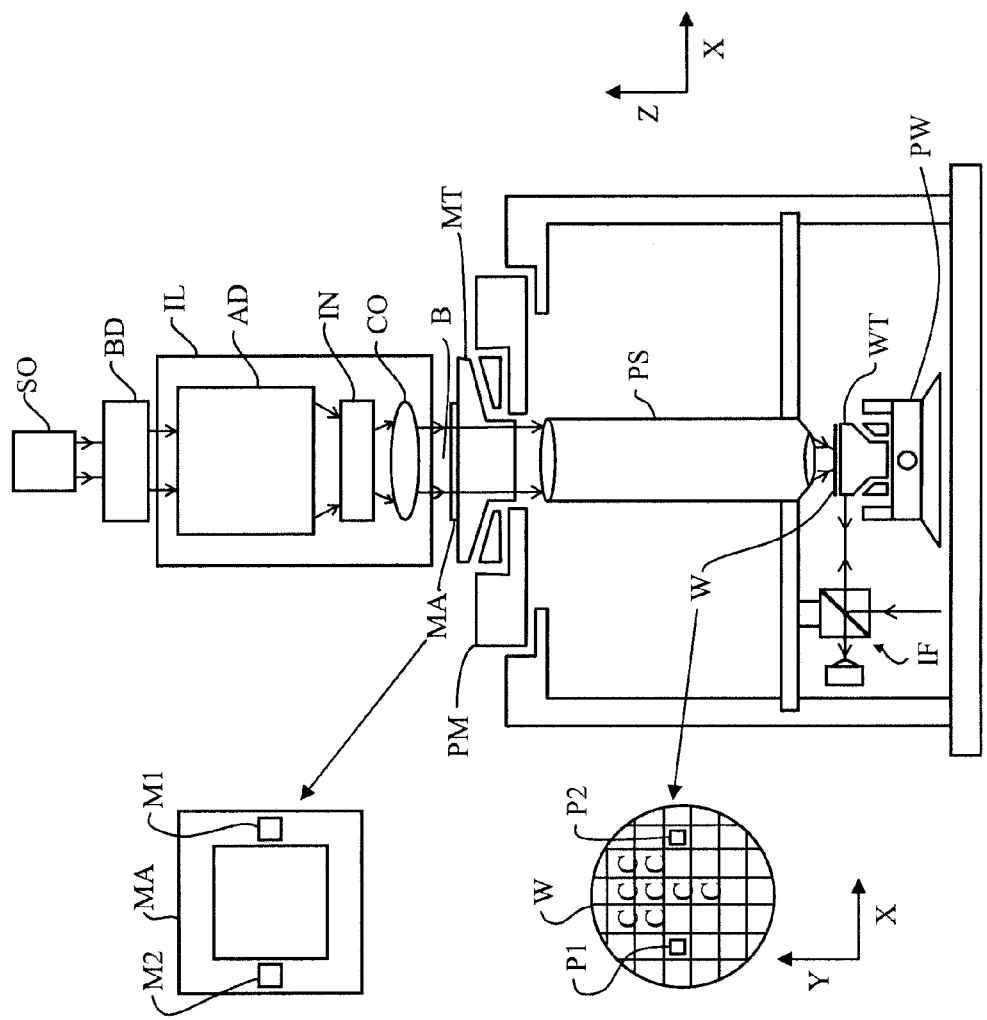
FIG. 8 schematically depicts a lithographic projection apparatus suitable for use with the method of the present invention.

FIG. 8 schematically depicts an exemplary lithographic projection apparatus whose performance could be simulated and/or optimized utilizing the computational lithography models that are calibrated using the test pattern selection process of present invention. The apparatus comprises:

a radiation system Ex, IL, for supplying a projection beam B of radiation. In this particular case, the radiation system also comprises a radiation source SO;

a first object table (mask table) MT provided with a mask holder for holding a mask MA (e.g., a reticle), and connected to first positioning means PM for accurately positioning the mask with respect to projection system PS;

a second object table (substrate table) WT provided with a substrate holder for holding a substrate W (e.g., a resist-coated silicon wafer), and connected to second positioning means PW for accurately positioning the substrate with respect to projection system PS;

a projection system ("lens") PS (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander or beam delivery system BD, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the mask MA has a desired uniformity and intensity distribution in its cross-section.

It should be noted with regard to FIG. 8 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing). The current invention encompasses at least both of these scenarios.

The beam B subsequently intercepts the mask MA, which is held on a mask table MT. Having traversed the mask MA, the beam B passes through the lens PS, which focuses the beam PS onto a target portion C of the substrate W. With the aid of the second positioning means (and interferometric measuring means IF), the substrate table WT can be moved accurately, e.g. so as to position different target portions C in the path of the beam B. Similarly, the first positioning means can be used to accurately position the mask MA with respect to the path of the beam B, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 8. However, in the case of a wafer stepper (as opposed to a step-and-scan tool) the mask table MT may just be connected to a short stroke actuator, or may be fixed.

Patterning device MA and substrate W may be aligned using alignment marks M1, M2 in the patterning device, and alignment marks P1, P2 on the wafer, as required.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam B;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include DUV (deep ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

The invention may be further described using the following clauses:

1. A method of optimizing an initial design rule into an updated design rule for producing a mask layout to be imaged by a lithographic apparatus, the method comprising:

selecting an initial design rule for the mask layout;

selecting an autocorrelation function associated with a predefined optical condition of the lithographic apparatus;

selecting respective diffraction order functions for at least two polygons in the mask layout;

determining a desired distance between the at least two polygons by cross-correlating the diffraction order functions and the autocorrelation function; and updating the initial design rule to generate the updated design rule based on the determined value of the desired distance between the at least two polygons.

2. The method of clause 1, wherein selecting the autocorrelation function includes:

using one or more eigenfunctions from singular value decomposition of transmission cross coefficient (TCC) matrix corresponding to the predefined optical condition comprising a predefined illumination condition and a predefined projection optics condition.

3. The method of clause 1, wherein selecting the autocorrelation function includes:

identifying a first portion of the mask layout that includes a plurality of critical polygons; and performing a source-mask optimization process based on the plurality of critical polygons to determine the predefined optical condition corresponding to the autocorrelation function.

4. The method of clause 3, wherein the method further includes:
optimizing the initial design rule based on the source-mask optimization for a second portion of the mask layout that includes the at least two polygons but excludes the plurality of critical polygons.

5. The method of clause 4, wherein selecting the initial design rule includes:
selecting an initial distance between the at least two polygons in the second portion of the mask layout based on the source-mask optimization performed using the plurality of critical polygons.

6. The method of clause 1, wherein determining the desired distance includes:
using translation properties of Fourier transform of the diffraction order functions.

7. The method of clause 1, wherein determining the desired distance between the at least two adjacent polygons includes:
calculating an image log slope (ILS) of an intensity profile at an edge of a calculated image of a first polygon including a contribution of a calculated image of at least one other polygon located at an initial distance '$a_0$' defined in the initial design rule;
tracking variation of the ILS with variation of '$a_0$'; and
selecting a value of '$a_0$' where the variation of the ILS is minimal to be the desired distance between the first polygon and the at least one other polygon.

8. The method of clause 7, wherein the at least one other polygons is located within an ambit distance from the edge of the first polygon.

9. The method of clause 1, wherein the method further comprises:
optimizing the mask layout by repositioning the polygons using the updated design rule.

10. The method of clause 9, wherein the method further comprises:
performing a subsequent source-mask optimization process after the mask layout is optimized using the updated design rule.

11. The method of clause 9, where the method further comprises:
applying optical proximity correction (OPC) to the optimized mask layout.

12. A computer program product comprising a computer-readable medium having instructions recorded therein, which when executed, cause the computer to generate files corresponding to a mask layout having a plurality of polygons to be imaged by a lithographic apparatus, the generation of the files comprising the steps of:
selecting an initial design rule for the mask layout;
selecting an autocorrelation function associated with a predefined optical condition of the lithographic apparatus;
selecting respective diffraction order functions for at least two polygons in the mask layout;
determining a desired distance between the at least two polygons by cross-correlating the diffraction order functions and the autocorrelation function; and
updating the initial design rule to generate the updated design rule based on the determined value of the desired distance between the at least two polygons.

13. The computer program product of clause 12, wherein selecting the autocorrelation function includes:
using one or more eigenfunctions from singular value decomposition of transmission cross coefficient (TCC) matrix corresponding to the predefined optical condition comprising a predefined illumination condition and a predefined projection optics condition.

14. The computer program product of clause 12, wherein selecting the autocorrelation function includes:
identifying a first portion of the mask layout that includes a plurality of critical polygons; and
performing a source-mask optimization process based on the plurality of critical polygons to determine the predefined optical condition corresponding to the autocorrelation function.

15. The computer program product of clause 14, wherein the generation of the files is used as an optimization method for updating the initial design rule based on the results of the source mask optimization for a second portion of the mask layout that includes the at least two polygons but excludes the plurality of critical polygons.

16. The computer program product of clause 15, wherein selecting the initial design rule includes:
selecting an initial distance between the at least two polygons in the second portion of the mask layout based on the source-mask optimization performed using the plurality of critical polygons.

17. The computer program product of clause 12, wherein determining the desired distance includes:
using translation properties of Fourier transform of the diffraction order functions.

18. The computer program product of clause 12, wherein the step of determining the desired distance between the at least two polygons includes:
calculating an image log slope (ILS) of an intensity profile at an edge of a calculated image of a first polygon including a contribution of a calculated image of at least one other polygon located at an initial distance '$a_0$' defined in the initial design rule;
tracking variation of the ILS with variation of '$a_0$'; and
selecting a value of '$a_0$' where the variation of the ILS is minimal to be the desired distance between the first polygon and the at least one other polygon.

19. The computer program product of clause 18, wherein the at least one other polygon is located within an ambit distance from the edge of the first polygon.

20. The computer program product of clause 12, wherein the generation of the files further comprises:
optimizing the mask layout by repositioning the polygons using the updated design rule.

21. The computer program product of clause 20, wherein the generation of the files further comprises:
performing a subsequent source-mask optimization process after the mask layout is optimized using the updated design rule.

22. The computer program product of clause 20, where the generation of the files further comprises:
applying optical proximity correction (OPC) to the optimized mask layout.

23. A method of generating a design rule defining relative positioning of polygons in an integrated circuit design, the design rule being usable for producing a mask layout for a mask for a lithographic apparatus comprising predefined optical conditions, the method comprising the steps of:
calculating an image log slope (ILS) of an intensity profile at an edge of a calculated image of a first polygon including a contribution of a calculated image of a further polygon located at a distance '$a_0$', the first polygon and the further polygon being part of the integrated circuit design, the image log slope comprising an autocorrelation function associated with the predefined optical conditions multiplied with respective diffraction order functions for the first polygon and the further polygon;

calculating a value of the distance '$a_0$' being a desired distance in which variation of the image log slope (ILS) with the distance is minimal; and generating the design rule using the desired distance '$a_0$' for repositioning at least one of the first and further polygons in the integrated circuit design.

24. The method of clause 23, wherein calculating the image log slope comprises including respective contributions of a plurality of further polygons.

25. The method of clause 24, wherein contributions of the further polygons from the plurality of further polygons that are within an ambit distance from the edge of the first polygon are considered for calculating the ILS.

26. The method of any of the clauses 23 to 25, wherein calculation of distance '$a_0$' includes using a translation property of a Fourier transform.

27. The method of any of the clauses 23 to 26, wherein zero order contributions of the further polygons are neglected.

28. The method of any of the clauses 23 to 27, wherein the autocorrelation function is a predefined autocorrelation function comprising one or more eigenfunctions from singular value decomposition of transmission cross coefficient (TCC) matrix.

29. The method of any of the clauses 23 to 28, wherein the autocorrelation function is pre-calculated during a source mask optimization process for defining at least a part of the predefined optical conditions of the lithographic apparatus.

30. The method of any of the clauses 23 to 29, wherein the method is used as a post-optimization method for a portion of the mask comprising non-critical polygons after the mask has been optimized for critical polygons.

31. The method of clauses 30, wherein an initial distance between the first polygon and the further polygon at the start of the calculating the value of the desired distance is defined by a set of design rules used for critical polygons.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

While specific embodiments of the invention have been described above, it will be appreciated that the invention may be practiced otherwise than as described.

The descriptions above are intended to be illustrative, not limiting, Thus, it will be apparent to those skilled in the art that modifications may be made to the invention as described without departing from the scope of the claims set out below.

What is claimed is:

1. A method, implemented by a computer, of optimizing an initial design rule into an updated design rule for producing a mask layout to be imaged by a lithographic apparatus, the method comprising:

selecting an initial design rule for the mask layout;

selecting an autocorrelation function associated with a predefined optical condition of the lithographic apparatus;

selecting respective diffraction order functions for at least two polygons in the mask layout;

determining, using the computer, a desired distance between the at least two polygons by cross-correlating the diffraction order functions and the autocorrelation function to obtain an estimate of illumination intensity at locations of a wafer plane associated with the at least two polygons upon an illumination of the mask layout by the lithographic apparatus;

updating the initial design rule to generate the updated design rule based on the determined value of the desired distance between the at least two polygons; and wherein determining the desired distance between the at least two adjacent polygons includes:

calculating an image log slope (ILS) of an intensity profile at an edge of a calculated image of a first polygon including a contribution of a calculated image of at least one other polygon located at an initial distance '$a_0$' defined in the initial design rule;

tracking variation of the ILS with variation of '$a_0$'; and selecting a value of '$a_0$' where the variation of the ILS is minimal to be the desired distance between the first polygon and the at least one other polygon.

2. The method of claim 1, wherein selecting the autocorrelation function includes:

using one or more eigenfunctions from singular value decomposition of transmission cross coefficient (TCC) matrix corresponding to the predefined optical condition comprising a predefined illumination condition and a predefined projection optics condition.

3. The method of claim 1, wherein selecting the autocorrelation function includes:

identifying a first portion of the mask layout that includes a plurality of critical polygons; and performing a source-mask optimization process based on the plurality of critical polygons to determine the predefined optical condition corresponding to the autocorrelation function.

4. The method of claim 3, wherein the method further includes:

optimizing the initial design rule based on the source-mask optimization for a second portion of the mask layout that includes the at least two polygons but excludes the plurality of critical polygons.

5. The method of claim 4, wherein selecting the initial design rule includes:

selecting an initial distance between the at least two polygons in the second portion of the mask layout based on the source-mask optimization performed using the plurality of critical polygons.

6. The method of claim 1, wherein determining the desired distance includes:

using translation properties of Fourier transform of the diffraction order functions.

7. The method of claim 1, wherein the at least one other polygon is located within an ambit distance from the edge of the first polygon.

8. The method of claim 1, wherein the method further comprises:

optimizing the mask layout by repositioning the polygons using the updated design rule.

9. A computer program product comprising a non-transitory computer-readable medium having instructions recorded therein, which when executed, cause the computer to generate files corresponding to a mask layout having a plurality of polygons to be imaged by a lithographic apparatus, the generation of the files comprising the steps of:

selecting an initial design rule for the mask layout;
selecting an autocorrelation function associated with a predefined optical condition of the lithographic apparatus;
selecting respective diffraction order functions for at least two polygons in the mask layout;
determining a desired distance between the at least two polygons by cross-correlating the diffraction order functions and the autocorrelation function to obtain an estimate of illumination intensity at locations of a wafer plane associated with the at least two polygons upon an illumination of the mask layout by the lithographic apparatus;
updating the initial design rule to generate the updated design rule based on the determined value of the desired distance between the at least two polygons; and
wherein the step of determining the desired distance between the at least two polygons includes:
calculating an image log slope (ILS) of an intensity profile at an edge of a calculated image of a first polygon including a contribution of a calculated image of at least one other polygon located at an initial distance '$a_0$' defined in the initial design rule;
tracking variation of the ILS with variation of '$a_0$'; and
selecting a value of '$a_0$' where the variation of the ILS is minimal to be the desired distance between the first polygon and the at least one other polygon.

10. The computer program product of claim 9, wherein selecting the autocorrelation function includes:
using one or more eigenfunctions from singular value decomposition of transmission cross coefficient (TCC) matrix corresponding to the predefined optical condition comprising a predefined illumination condition and a predefined projection optics condition.

11. The computer program product of claim 9, wherein selecting the autocorrelation function includes:
identifying a first portion of the mask layout that includes a plurality of critical polygons; and
performing a source-mask optimization process based on the plurality of critical polygons to determine the predefined optical condition corresponding to the autocorrelation function.

12. The computer program product of claim 11, wherein the generation of the files is used as an optimization method for updating the initial design rule based on the results of the source mask optimization for a second portion of the mask layout that includes the at least two polygons but excludes the plurality of critical polygons.

13. The computer program product of claim 12, wherein selecting the initial design rule includes:
selecting an initial distance between the at least two polygons in the second portion of the mask layout based on the source-mask optimization performed using the plurality of critical polygons.

14. The computer program product of claim 9, wherein the at least one other polygon is located within an ambit distance from the edge of the first polygon.

15. The computer program product of claim 9, wherein the generation of the files further comprises:
optimizing the mask layout by repositioning the polygons using the updated design rule.

16. A method, implemented by a computer, of generating a design rule defining relative positioning of polygons in an integrated circuit design, the design rule being usable for producing a mask layout for a mask for a lithographic apparatus comprising predefined optical conditions, the method comprising the steps of:
calculating, using the computer, an image log slope (ILS) of an intensity profile at an edge of a calculated image of a first polygon at locations of a wafer plane associated with the first polygon upon an illumination of the mask layout by the lithographic apparatus including a contribution of a calculated image of a further polygon located at a distance '$a_0$' at the locations of the wafer plane associated with the first polygon, the first polygon and the further polygon being part of the integrated circuit design, the image log slope comprising an autocorrelation function associated with the predefined optical conditions multiplied with respective diffraction order functions for the first polygon and the further polygon;
calculating a value of the distance '$a_0$' being a desired distance in which variation of the image log slope (ILS) with the distance is minimal; and
generating the design rule using the desired distance '$a_0$' for repositioning at least one of the first and further polygons in the integrated circuit design.

17. The method of claim 16, wherein calculating the image log slope comprises including respective contributions of a plurality of further polygons.

18. The method of claim 17, wherein contributions of the further polygons from the plurality of further polygons that are within an ambit distance from the edge of the first polygon are considered for calculating the ILS.

* * * * *

UNITED STATES PATENT AND TRADEMARK OFFICE
CERTIFICATE OF CORRECTION

PATENT NO. : 8,612,900 B2  Page 1 of 1
APPLICATION NO. : 13/042303
DATED : December 17, 2013
INVENTOR(S) : Socha It is certified that error appears in the above-identified patent and that said Letters Patent is hereby corrected as shown below:

On Title Page, Item [54] and in the Specification, Column 1, Title delete "RULE OPTIMIZATION IN LITHOGRAPHIC IMAGING BASED ON CORRELATION OF FUNCTIONS REPRESENTING MASK AND PREDEFINED OPTICAL CONDITIONS"

and insert --DESIGN RULE OPTIMIZATION IN LITHOGRAPHIC IMAGING BASED ON CORRELATION OF FUNCTIONS REPRESENTING MASK AND PREDEFINED OPTICAL CONDITIONS--.

Signed and Sealed this
Fifteenth Day of April, 2014

Michelle K. Lee
*Deputy Director of the United States Patent and Trademark Office*